(12) United States Patent
Lee

(10) Patent No.: US 8,242,574 B2
(45) Date of Patent: Aug. 14, 2012

(54) METHOD FOR FORMING ISOLATION LAYER OF SEMICONDUCTOR DEVICE

(75) Inventor: Yu-Jin Lee, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 102 days.

(21) Appl. No.: 12/833,568

(22) Filed: Jul. 9, 2010

(65) Prior Publication Data

US 2011/0049669 A1 Mar. 3, 2011

(30) Foreign Application Priority Data

Sep. 2, 2009 (KR) .................. 10-2009-0082701

(51) Int. Cl.
*H01L 29/06* (2006.01)
*H01L 21/762* (2006.01)
(52) U.S. Cl. ...................................... 257/510
(58) Field of Classification Search .......... 438/221, 438/424, 257, 435, 267, 978, 751, 365, 41, 438/201, 211, 216, 240, 222, 218, 429, 413; 257/E21.546, E21.549, E21.573, 304, 310, 257/374, 508, E29.131, E29.152, E23.061, 257/E23.133

See application file for complete search history.

(56) References Cited

U.S. PATENT DOCUMENTS

| | | | | |
|---|---|---|---|---|
| 2008/0003739 A1* | 1/2008 | Lee et al. | ..................... | 438/221 |
| 2008/0182382 A1* | 7/2008 | Ingle et al. | .................... | 438/435 |
| 2009/0170280 A1* | 7/2009 | Park | .............................. | 438/425 |
| 2009/0170283 A1* | 7/2009 | Sheen et al. | .................. | 438/437 |

FOREIGN PATENT DOCUMENTS

| | | |
|---|---|---|
| KR | 1020080052500 | 6/2008 |
| KR | 1020080088984 | 10/2008 |
| KR | 1020090048179 | 5/2009 |

OTHER PUBLICATIONS

Notice of Preliminary Rejection issued from Korean Intellectual Property Office on Mar. 24, 2011.

* cited by examiner

*Primary Examiner* — Dao H Nguyen
*Assistant Examiner* — Tram H Nguyen
(74) *Attorney, Agent, or Firm* — IP & T Group LLP

(57) ABSTRACT

A method for forming an isolation layer of a semiconductor device includes forming a trench in a substrate, forming a high-density plasma (HDP) oxide layer filling a portion of the trench, forming a spin-on-dielectric (SOD) oxide layer having a certain height over the HDP oxide layer, performing a thermal treatment, and forming an enhanced high-aspect-ratio process (eHARP) oxide layer filling another portion of the trench over the SOD oxide layer.

14 Claims, 5 Drawing Sheets

METHOD FOR FORMING ISOLATION LAYER OF SEMICONDUCTOR DEVICE

CROSS-REFERENCE TO RELATED APPLICATIONS

The present application claims priority of Korean Patent Application No. 10-2009-0082701, filed on Sep. 2, 2009, which is incorporated herein by reference in its entirety.

BACKGROUND OF THE INVENTION

Exemplary embodiments of the present invention relate to a technology for fabricating a semiconductor device, and more particularly, to a method for forming an isolation layer of a semiconductor device.

A Shallow Trench Isolation (STI) process is currently used to form trenches in a substrate to define active regions of a semiconductor device and to form an isolation layer by filling the trenches with an insulation layer.

A high-density plasma (HDP) oxide layer, a spin-on-dielectric (SOD) oxide layer, or a stacked structure of an SOD oxide layer and an HDP oxide layer may be used as the insulation layer filling the trenches.

However, as semiconductor devices continue to be highly integrated, a void or seam may occur in the HDP oxide layer. Also, as the active region is reduced, margins of error for subsequent processes (e.g., margins of error for gap-filling trenches for forming an isolation layer) become insufficient, and as a result, memory refresh period is reduced as well due to self-aligned contact failure and leakage current from a substrate. Moreover, while a deposition process and an etch process are repeated to deposit the HDP oxide layer, a liner oxide layer does not sufficiently protect a liner nitride layer, and as a result, some of the liner nitride layer is lost. Such a loss may, lead to liner nitride layer clipping at active corners.

On the other hand, the SOD oxide layer is advantageous in that the SOD oxide layer has an excellent gap-fill characteristic because it is formed through a coating process.

The SOD oxide layer, however, has high permeability and fast wet etch rate, which are disadvantageous characteristics.

To cure the SOD oxide layer and make the layer quality hard, an annealing process is performed after the formation of the SOD oxide layer. After the annealing process, wide areas are cured and the layer quality of the SOD oxide layer becomes harder, but portions filling the trenches remain uncured. Also, in narrow areas, the extent of curing differs according to the depth of a trench, and the SOD oxide layer shrinks as it is cured.

Since the layer quality differs depending on the annealing conditions, it is difficult to use the SOD oxide layer. For example, the SOD oxide layer is not completely cured in a narrow area, and thus, out-gassing occurs continuously during a subsequent thermal treatment and the out-gassing changes the layer quality. Since the layer quality is changed, the etch rate may become different and defects may be caused. Also, since there are differences in the shrinkage of the SOD oxide layer and stress-related changes as a result of the annealing process, a crack may occur at the boundary between the SOD oxide layer and a peripheral layer.

SUMMARY OF THE INVENTION

Exemplary embodiments of the present invention are directed to a method for forming an isolation layer of a semiconductor device that improves a gap-fill performance into trenches and memory refresh performance.

In accordance with an exemplary embodiment of the present invention, a method for forming an isolation layer of a semiconductor device includes forming a trench in a substrate, forming a high-density plasma (HDP) oxide layer filling a portion of the trench, forming a spin-on-dielectric (SOD) oxide layer having a certain height over the HDP oxide layer, performing a thermal treatment, and forming an enhanced high-aspect-ratio process (eHARP) oxide layer filling another portion of the trench over the SOD oxide layer.

The forming of the trench in the substrate may include: forming a pad oxide layer pattern and a pad nitride layer pattern over the substrate, and etching the substrate by using the pad nitride layer pattern as an etch barrier. The method may further include removing the pad nitride layer pattern, after the forming of the eHARP oxide layer. The trench may have a depth ranging from approximately 500 Å to approximately 3,200 Å.

The forming of the HDP oxide layer may include forming an HDP oxide filling the trench, performing a backside etch process onto the HDP oxide, performing an annealing process onto the HDP oxide, planarizing the HDP oxide, and performing a wet etch process onto the HDP oxide. The wet-etched HDP oxide may have a thickness ranging from approximately 500 Å to approximately 800 Å. The annealing process may be performed in the atmosphere of nitrogen at the temperature of approximately 600° C. to approximately 1,000° C. for approximately 30 seconds to approximately 3 minutes.

The forming of the SOD oxide layer may include forming an SOD oxide filling the trench over the HDP oxide layer, curing the SOD oxide, planarizing the SOD oxide, and performing a wet etch process onto the SOD oxide. The SOD oxide layer may include a polysilazane (PSZ) layer. The curing of the SOD oxide may be performed in the atmosphere of water ($H_2O$) at a temperature ranging from approximately 250° C. to approximately 400° C. The wet-etched SOD oxide may have a thickness ranging from approximately 800 Å to approximately 1,500 Å.

The thermal treatment may be performed using water ($H_2O$).

The forming of the eHARP oxide layer may include forming the eHARP oxide over the SOD oxide layer, performing an annealing process onto the eHARP oxide, and planarizing the eHARP oxide. The annealing process may be performed in the atmosphere of nitrogen at a temperature of approximately 600° C. to approximately 1,000° C. for approximately 1 hour to approximately 2 hours.

The removing of the pad nitride layer pattern may be performed through a wet etch process. The wet etch process may be performed using phosphoric acid.

In accordance with another exemplary embodiment of the present invention, an isolation layer of a semiconductor device includes a trench in a substrate, a high-density plasma (HDP) oxide layer filling a portion of the trench, a spin-on-dielectric (SOD) oxide layer having a certain height over the HDP oxide layer, and an enhanced high-aspect-ratio process (eHARP) oxide layer filling another portion of the trench over the SOD oxide layer, wherein the SOD oxide layer has undergone a thermal treatment.

Moreover, the eHARP oxide layer may be the result of a chemical reaction between a tetraethyl ortho silicate (TEOS) oxide layer and water.

DESCRIPTION OF SPECIFIC EMBODIMENTS

Figure 1A:
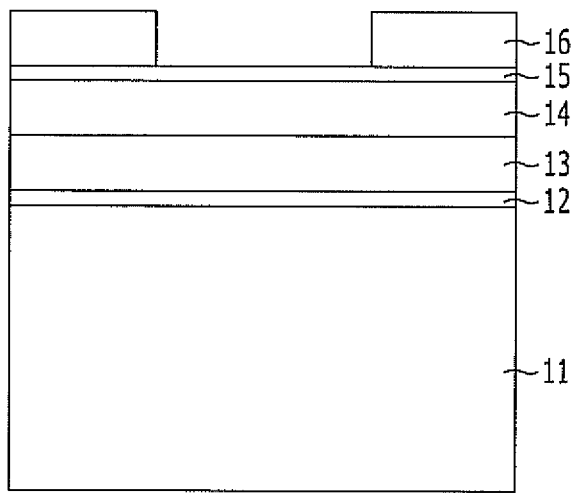
FIGS. 1A to 1H are cross-sectional views illustrating a method for forming an isolation layer of a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1A to 1H are cross-sectional views illustrating a method for forming an isolation layer of a semiconductor device in accordance with an embodiment of the present invention.

Referring to FIG. 1A, a pad oxide layer 12 and a pad nitride layer 13 are formed over a substrate 11. The substrate 11 may be a semiconductor substrate, such as a silicon substrate. The pad oxide layer 12 protects the substrate 11 during a subsequent etch process, and it protects the substrate 11 when the pad nitride layer 13 is removed in a subsequent process. The pad oxide layer 12 may be formed to have a thickness ranging from approximately 30 Å to approximately 200 Å.

The pad nitride layer 13 serves as an etch barrier when trenches are subsequently formed and as a target for a planarization process, that is, an etch stop layer for planarization when an isolation layer is subsequently formed. The pad nitride layer 13 is formed with a thickness that may be sufficiently etched through to the substrate 11 in order to form trenches. For example, the thickness of the pad nitride layer 13 may range from approximately 400 Å to approximately 800 Å.

Subsequently, a hard mask layer 14 is formed over the pad nitride layer 13. The hard mask layer 14 is for etching the pad nitride layer 13 and the hard mask layer 14 may be formed of a carbon-based material, such as amorphous carbon. The hard mask layer 14 is formed with a thickness that may be sufficiently etched through to etch the pad nitride layer 13. For example, the thickness of the hard mask layer 14 may range from approximately 1,500 Å to approximately 3,000 Å.

Subsequently, a silicon oxynitride layer 15 is formed over the hard mask layer 14. The silicon oxynitride layer 15 serves as an etch barrier for preventing a footing phenomenon between the hard mask layer 14 formed of the carbon-based material and a photoresist pattern to be formed subsequently. Further, the silicon oxynitride layer is used for etching the hard mask layer 14. Also, the silicon oxynitride layer 15 functions as an anti-reflection layer during an exposure process when a photoresist pattern is formed in a subsequent process. The silicon oxynitride layer 15 may be formed with a thickness ranging from approximately 200 Å to approximately 600 Å. Although not illustrated in the drawing, a Bevel etch process is performed to reduce particles formed over the substrate 11, after the formation of the silicon oxynitride layer 15.

Subsequently, a photoresist pattern 16 is formed over the silicon oxynitride layer 15. The photoresist pattern 16 is formed by coating the silicon oxynitride layer 15 with a photoresist layer and patterning the photoresist layer in such a manner that an isolation region is opened through exposure and development processes. When the photoresist pattern 16 is formed, an anti-reflective layer may be further formed over the silicon oxynitride layer 15 to prevent reflection during the exposure process.

Figure 1B:
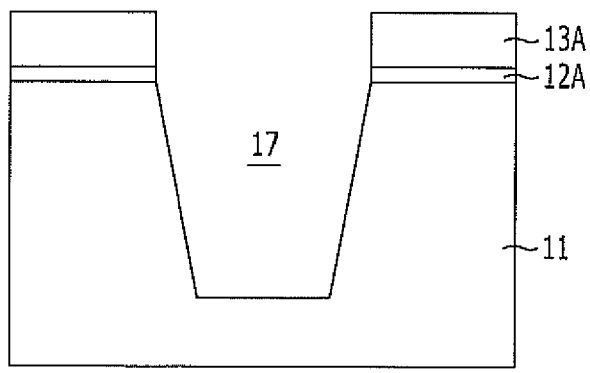

Referring to FIG. 1B, the silicon oxynitride layer 15 (refer to FIG. 1A) is etched using the photoresist pattern 16 (refer to FIG. 1A). Then, the hard mask layer 14 (refer to FIG. 1A) is etched using the silicon oxynitride layer 15 as an etch barrier.

Subsequently, the pad nitride layer 13 and the pad oxide layer 12 are etched using the hard mask layer 14 as an etch barrier. Hereafter, the etched pad nitride layer 13 and pad oxide layer 12 are referred to as a pad nitride layer pattern 13A and a pad oxide layer pattern 12A, respectively.

Subsequently, trenches 17 are formed by etching the substrate 11. The trenches 17 may be formed to a depth ranging from approximately 500 Å to approximately 3,200 Å.

The photoresist pattern 16 (refer to FIG. 1A), the silicon oxynitride layer 15 (refer to FIG. 1A), and the hard mask layer 14 (refer to FIG. 1A) may be removed after the pad nitride layer 13 and pad oxide layer 12 are etched to become the pad nitride layer pattern 13A and the pad oxide layer pattern 12A, respectively, or they may be removed after the trenches 17 are formed.

Figure 1C:
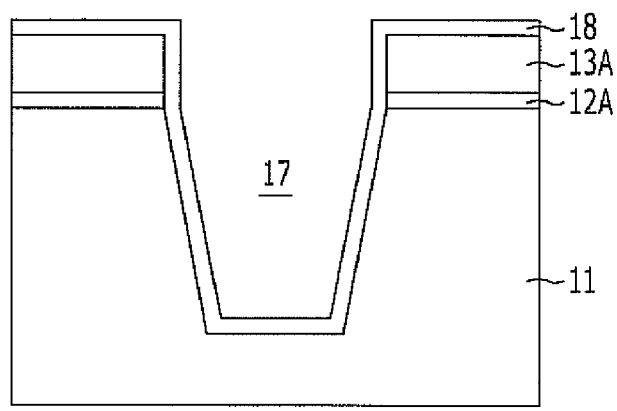

Referring to FIG. 1C, a protective layer 18 is formed along the profile of the resultant structure, including the substrate 11, the pad oxide layer pattern 12A, the pad nitride layer pattern 13A, and the trenches 17. The protective layer 18 protects the substrate 11 during a subsequent process for forming an isolation layer. The protective layer 18 may be formed with a stacked structure of a wall oxide layer, a liner nitride layer, and a liner oxide layer. Moreover, the liner oxide layer may be formed of any one selected from the group consisting of low-pressure tetraethyl orthosilicate (LP-TEOS), high-temperature oxide (HTO) and inter-polyoxide (IPO).

Herein, the wall oxide layer of the protective layer 18 may have a thickness ranging from approximately 50 Å to approximately 80 Å, and the liner nitride layer of the protective layer 18 may have a thickness ranging from approximately 40 Å to approximately 100 Å. The liner oxide layer of the protective layer 18 may have a thickness ranging from approximately 40 Å to approximately 100 Å.

Figure 1D:
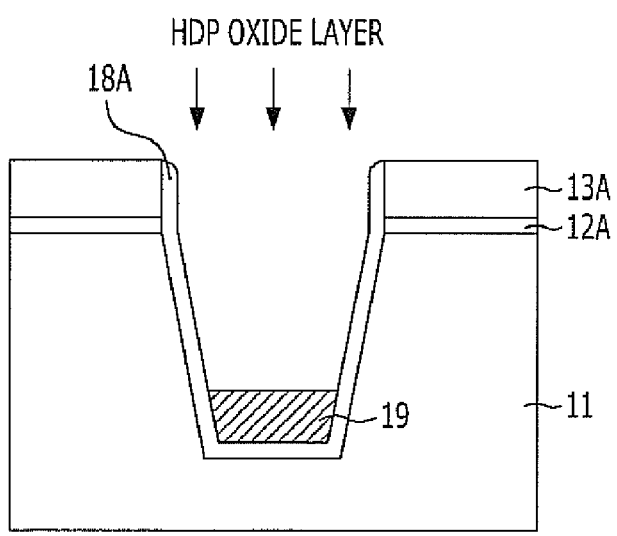

Referring to FIG. 1D, a high-density plasma (HDP) oxide layer 19 filling a portion of each trench 17 is formed.

The HDP oxide layer 19 filling a portion of each trench 17 is formed by performing the following steps in the following order: depositing an HDP oxide layer on the trenches 17, performing a backside etch process, performing an annealing process, performing a planarization process such as a Chemical Mechanical Polishing (CMP) method, and lastly performing a wet etch process. Herein, the annealing process may be performed in the atmosphere of nitrogen at a temperature of approximately 600° C. to approximately 1,000° C. for approximately 30 seconds to approximately 3 minutes.

The HDP oxide layer 19 may be initially deposited in a thickness ranging from approximately 500 Å to approximately 2,000 Å. The HDP oxide layer 19 which is etched and fills a portion of each trench 17 may remain in a thickness ranging from approximately 500 Å to approximately 800 Å from the bottom of each trench 17 to the highest portion of the HDP oxide layer 19.

When the HDP oxide layer 19 is formed, the protective layer 18 (refer to FIG. 1C) formed on the upper portion of the pad nitride layer pattern 13A is lost, but remains on the internal walls of each trench 17 and the sidewalls of the pad oxide layer pattern 12A and the pad nitride layer pattern 13A by the time when the formation of the HDP oxide layer 19 is completed. The remaining protective layer 18 is referred to as a protective layer pattern 18A.

Figure 1E:
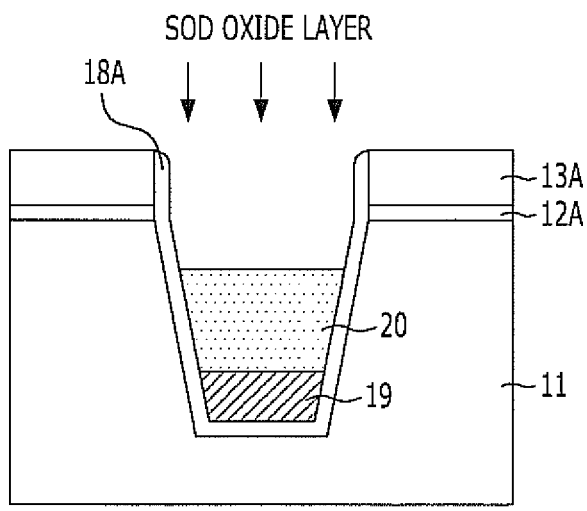

Referring to FIG. 1E, a spin-on-dielectric (SOD) oxide layer 20 is formed over the HDP oxide layer 19.

The SOD oxide layer 20 is formed by coating the HDP oxide layer 19 with a polysilazane (PSZ) layer through an SOD process to fill the trenches 17 and performing a curing process. The curing process is performed to turn the polysilazane layer into an SOD oxide layer 20. The curing process may be performed at a low temperature in a wet environment. For example, the curing process may be performed in the atmosphere of water ($H_2O$) at a temperature ranging from approximately 250° C. to approximately 400° C.

When the curing process is performed in the atmosphere of water ($H_2O$), the polysilazane-based SOD oxide layer 20 chemically reacts and out-gasses ammonia ($NH_3$) and hydrogen ($H_2$) to turn into a silicon oxide (SiO) layer. In other words, a polysilazane-based SOD layer containing silicon (Si), nitrogen (N) and hydrogen (H) reacts with water ($H_2O$) to generate ammonia ($NH_3$) and hydrogen ($H_2$) gases which are out-gassed, and Si and oxygen (O) are combined to become silicon oxide.

Also, the curing process accelerates the out-gassing from the inside of the SOD layer so as to acquire a layer quality with an improved porous characteristic. Herein, if the curing process is performed at a temperature lower than approximately 250° C., the Si—H bond is not broken. Thus, the curing process speed is decreased and the out-gassing is not performed sufficiently. If the curing process is performed at a temperature higher than approximately 400° C., stress is observed due to rapid shrinkage of the layer. In short, the temperature of the curing process heavily influences the process speed, extent of out-gassing, thickness (or shrinkage), refractive index, and extent of stress in the SOD layer. Thus, it is desirable to perform the curing process within a temperature range of approximately 250° C. to approximately 400° C.

Subsequently, the planarization process is performed using, for example, the CMP method, and the wet etch process is performed. Herein, the SOD oxide layer 20 may be initially formed with a thickness ranging from approximately 3,000 Å to approximately 6,000 Å. The SOD oxide layer 20 which is planarized using the CMP method may remain with a thickness ranging from approximately 800 Å to approximately 1,500 Å from the upper portion of the HDP oxide layer 19.

Figure 1F:
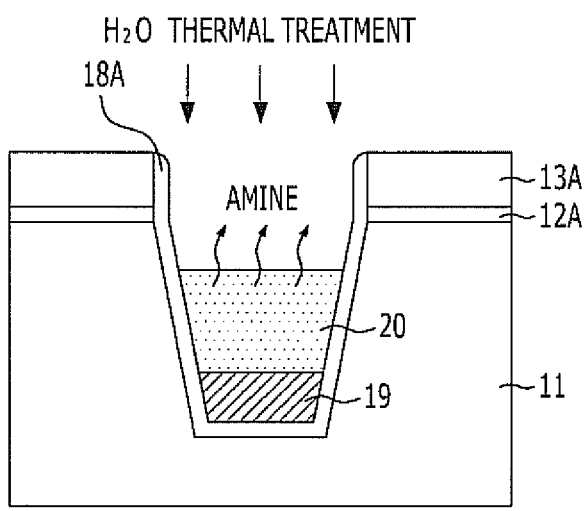

Referring to FIG. 1F, a thermal treatment is performed using water ($H_2O$) onto the substrate 11 with the SOD oxide layer 20.

The thermal treatment is performed to remove amines remaining on the surface of the SOD oxide layer 20. The amines remaining on the surface of the SOD oxide layer 20 may penetrate into an upper layer of the silicon oxide layer during a subsequent process to turn the upper layer back into SOD. As a result, the layer quality may be changed, and therefore, the etch rate may be changed during a subsequent CMP or wet etch process.

Accordingly, the thermal treatment using water ($H_2O$) is performed to remove the amines from the surface of the SOD oxide layer 20 in order to prevent them from penetrating into the upper layer of the silicon oxide layer.

Figure 1G:
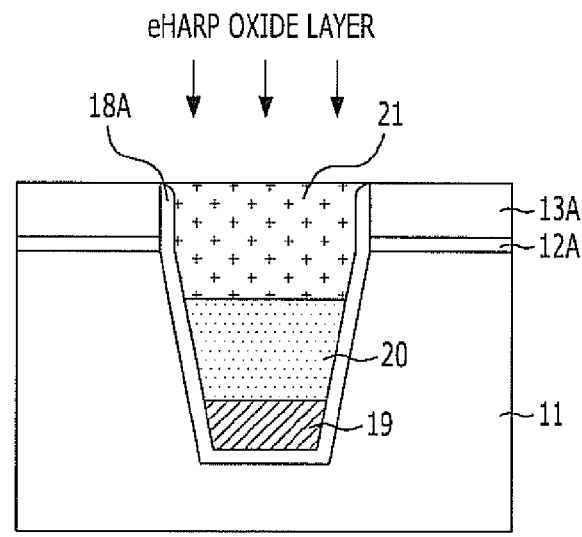

Referring to FIG. 1G, an enhanced high-aspect-ratio process (eHARP) oxide layer 21 is formed over the SOD oxide layer 20.

The eHARP oxide layer 21 is formed by performing the following steps in the following order: forming an eHARP oxide layer over the SOD oxide layer 20, performing an annealing process, and performing a CMP process until the surface of the pad nitride layer pattern 13A is exposed. Herein, the annealing process may be performed in an atmosphere of nitrogen at a temperature of approximately 600° C. to approximately 1,000° C. for approximately 1 hour to approximately 2 hours. Herein, the eHARP oxide layer 21 may be initially formed with a thickness ranging from approximately 3,000 Å to approximately 5,000 Å. The eHARP oxide layer 21 which is planarized using, for example, the CMP method may remain in a thickness ranging from approximately 800 Å to approximately 1,000 Å from the upper portion of the SOD oxide layer 20.

Concerns about a void and seam forming may be addressed by additionally forming the eHARP oxide layer 21 over the SOD oxide layer 20, and device failure occurring due to lack of sufficient error margins may be avoided by securing improved gap-fill margins. Also, since the HDP oxide layer 19 is formed in the lower portion of each trench 17, moat and clipping that are caused as the liner nitride layer is lost after repeated deposition and etch processes may be prevented. Moreover, since the eHARP oxide layer 21 protects the penetration of the amines into the SOD oxide layer 20, the SOD oxide layer 20 may be prevented from cracking.

The eHARP oxide layer 21 is described in detail with reference to FIG. 2.

Figure 2:
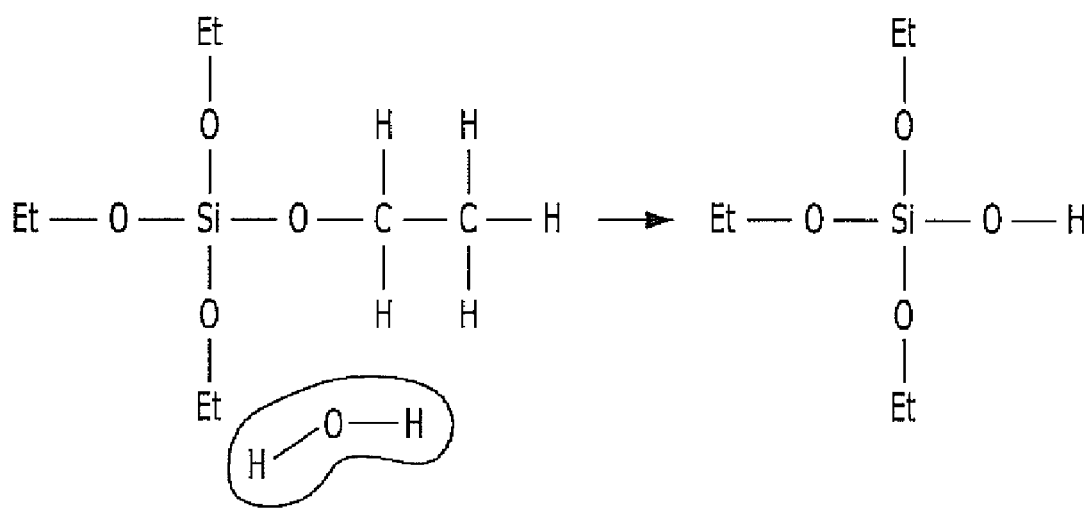
FIG. 2 shows a chemical formula for an enhanced high-aspect-ratio process (eHARP) oxide layer in accordance with an embodiment of the present invention.

FIG. 2 shows a chemical formula for describing eHARP oxide layer in accordance with an embodiment of the present invention.

Referring to FIG. 2, the eHARP oxide layer 21 may be a tetraethyl ortho silicate (TEOS) oxide layer. A TEOS oxide layer free of an ethyl bond obtained by using ozone ($O_3$) to remove the ethyl bond is referred to as an HARP oxide layer, and a TEOS oxide layer free of an ethyl bond obtained by using water ($H_2O$) to remove the ethyl bond is referred to as an enhanced HARP (eHARP) oxide layer.

An HARP oxide layer has a structure where a bond such as an O—Et bond or/and an O-C—H bond is added to a Si—O bond. Although the O—C—H bond is broken to become an O—H bond during the annealing process, an O-Et (which is an ethyl group) still exists.

On the other hand, the eHARP oxide layer 21 created using water ($H_2O$) may remove a seam by substituting an ethyl group with a hydroxyl (OH) group, and therefore, may form a layer having high conformal deposition and density. Consequently, leakage current may be prevented and therefore, a memory refresh characteristic may be improved.

Figure 1H:
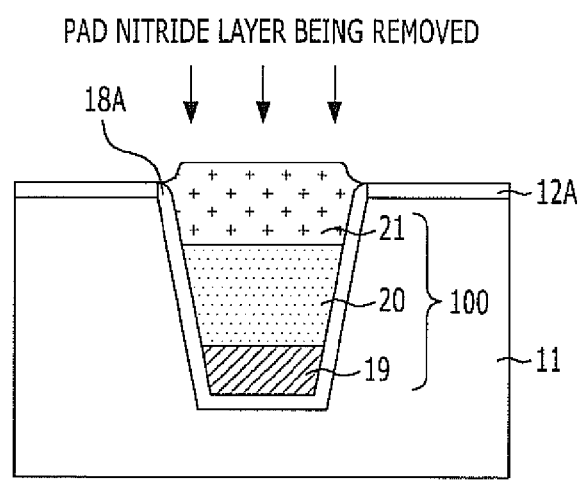

Referring to FIG. 1H, the pad nitride layer pattern 13A (refer to FIG. 1G) is removed. The pad nitride layer pattern 13A may be removed through a wet etch process. The wet etch process may be performed using phosphoric acid. For example, the pad nitride layer pattern 13A may be removed by dipping the substrate structure into a phosphoric acid solution for approximately 30 seconds to approximately 1 minute.

During the wet etch process, a portion of the eHARP oxide layer 21 may be lost thereby reducing the height (or thickness) of the eHARP oxide layer 21 by a certain amount.

As a result, an isolation layer 100 having a stacked structure of the HDP oxide layer 19, the SOD oxide layer 20, and the eHARP oxide layer 21 is formed inside each trench 17.

Subsequently, a screen oxide layer may be formed over the substrate 11. The screen oxide layer may be formed with a thickness ranging from approximately 30 Å to approximately 60 Å.

According to the method for forming an isolation layer of a semiconductor device suggested in the embodiments of the present invention, an isolation layer is formed by stacking an HDP oxide layer, an SOD oxide layer, and an eHARP oxide layer. Accordingly, gap-fill margins may be secured and device failure occurring due to the lack of sufficient gap-fill margins may be taken care of.

Also, since amines are removed from the SOD oxide layer by performing a thermal treatment using $H_2O$ after the formation of the SOD oxide layer and an eHARP oxide layer is formed over the SOD oxide layer, the occurrence of a void and seam may be prevented. As a result, leakage current may also be prevented and a memory refresh characteristic may be improved.

In addition, since a portion of each trench is filled with the HDP oxide layer, the protective layer may be prevented from being damaged.

While the present invention has been described with respect to the specific embodiments, it will be apparent to those skilled in the art that various changes and modifications may be made without departing from the spirit and scope of the invention as defined in the following claims.

What is claimed is:

1. A method for forming an isolation layer of a semiconductor device, comprising:
    forming a pad oxide layer pattern and a pad nitride layer pattern over a substrate;
    etching the substrate by using the pad nitride layer pattern as an etch barrier to form a trench in the substrate;
    forming a high-density plasma (HDP) oxide layer filling a portion of the trench;
    forming a spin-on-dielectric (SOD) oxide layer having a certain height over the HDP oxide layer;
    performing a thermal treatment;
    forming an enhanced high-aspect-ratio process (eHARP) oxide layer filling another portion of the trench over the SOD oxide layer; and
    removing the pad nitride layer pattern, after the forming of the eHARP oxide layer.

2. The method of claim 1, wherein the trench has a depth ranging from approximately 500 Å to approximately 3,200 Å.

3. The method of claim 1, wherein the forming of the HDP oxide layer comprises:
    forming an HDP oxide filling the trench;
    performing a backside etch process onto the HDP oxide;
    performing an annealing process onto the HDP oxide;
    planarizing the HDP oxide; and
    performing a wet etch process onto the HDP oxide.

4. The method of claim 3, wherein the wet-etched HDP oxide has a thickness ranging from approximately 500 Å to approximately 800 Å.

5. The method of claim 3, wherein the annealing process is performed in an atmosphere of nitrogen at a temperature of approximately 600° C. to approximately 1,000° C. for approximately 30 seconds to approximately 3 minutes.

6. The method of claim 1, wherein the forming of the SOD oxide layer comprises:
    forming an SOD oxide filling the trench over the HDP oxide layer;
    curing the SOD oxide;
    planarizing the SOD oxide; and
    performing a wet etch process onto the SOD oxide.

7. The method of claim 1, wherein the SOD oxide layer comprises a polysilazane (PSZ) layer.

8. The method of claim 6, wherein the curing of the SOD oxide is performed in an atmosphere of water ($H_2O$) at a temperature ranging from approximately 250° C. to approximately 400° C.

9. The method of claim 6, wherein the wet-etched SOD oxide has a thickness ranging from approximately 800 Å to approximately 1,500 Å.

10. The method of claim 1, wherein the thermal treatment is performed using water ($H_2O$).

11. The method of claim 1, wherein the forming of the eHARP oxide layer comprises:
    forming an eHARP oxide over the SOD oxide layer;
    performing an annealing process onto the eHARP oxide; and
    planarizing the eHARP oxide.

12. The method of claim 11, wherein the annealing process is performed in an atmosphere of nitrogen at a temperature of approximately 600° C. to approximately 1,000° C. for approximately 1 hour to approximately 2 hours.

13. The method of claim 1, wherein the removing of the pad nitride layer pattern is performed through a wet etch process.

14. The method of claim 13, wherein the wet etch process is performed using phosphoric acid.

* * * * *